United States Patent [19]

Ienaka et al.

[11] 4,037,056
[45] July 19, 1977

[54] FM MULTIPLEX DEMODULATOR CIRCUIT

[75] Inventors: Masanori Ienaka, Fuchu; Yukio Suzuki, Hinode, both of Japan

[73] Assignee: Hitachi, Ltd., Japan

[21] Appl. No.: 646,756

[22] Filed: Jan. 6, 1976

[30] Foreign Application Priority Data

Jan. 6, 1975 Japan .................................. 50-108

[51] Int. Cl.$^2$ ............................................. H04H 5/00
[52] U.S. Cl. ............................................... 179/15 BT
[58] Field of Search ............. 179/15 BT; 325/36, 485

[56] References Cited

U.S. PATENT DOCUMENTS

| | | | |
|---|---|---|---|
| 3,573,382 | 4/1971 | Feit et al. ......................... | 179/15 BT |
| 3,617,641 | 11/1971 | Feit et al. ......................... | 179/15 BT |
| 3,752,934 | 8/1973 | Nakamura et al. ............. | 179/15 BT |
| 3,823,268 | 7/1974 | Modafferi ......................... | 179/15 BT |
| 3,842,211 | 10/1974 | Metro ............................... | 179/15 BT |

*Primary Examiner*—Douglas W. Olms
*Attorney, Agent, or Firm*—Craig & Antonelli

[57] ABSTRACT

An FM multiplex demodulator circuit comprises, within a semiconductor integrated circuit, a double balance type synchronous detection circuit which includes load elements formed within the semiconductor integrated circuit, a pair of negative feedback type differential amplifier circuits which amplify a pair of detection outputs from the detection circuit and also perform de-emphasis thereof, respectively, and a pair of emitter follower circuits which are connected to outputs of the negative feedback type differential amplifier circuits, respectively.

6 Claims, 1 Drawing Figure

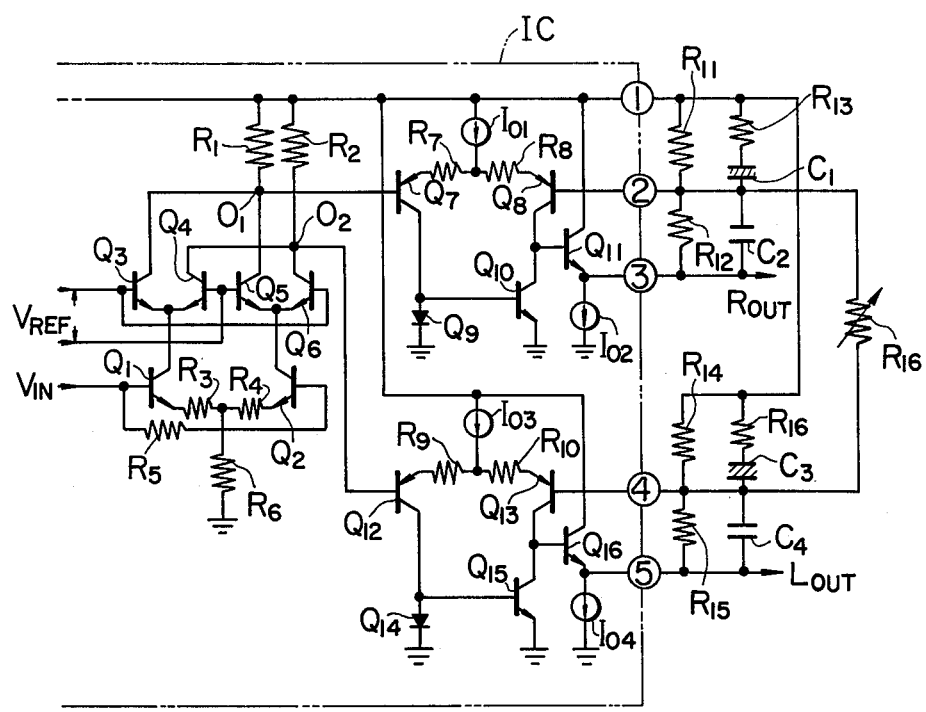

FM MULTIPLEX DEMODULATOR CIRCUIT

BACKGROUND OF THE INVENTION

1. Field of the Invention

This invention relates to an FM multiplex demodulator circuit. More particularly, it is directed to an FM multiplex demodulator circuit which is constructed into a semiconductor integrated circuit.

2. Description of the Prior Art

Although the PLL(phase locked loop) technique is conventional, because of the need for a complicated circuit arrangement and a high cost, its fields of utilization have been restricted to measuring instruments, space communications, etc.

With the progress and development of semiconductor integrated circuit technology, the fields of utilization have been expanded.

As an example, a double balance type synchronous detection circuit employed in an FM multiplex demodulator circuit has been developed. This circuit and a semiconductor integrated circuit are inseparable. The FM multiplex demodulator circuit formed as a semiconductor integrated circuit has heretofore acquired signal outputs of a right channel and a left channel by passing outputs of the synchronous detection circuit through an LPF (low-pass filter) as an externally-mounted circuit.

In a differential circuit which constitutes the synchronous detection circuit, in order to make the number of externally-mounted pins small and to realize de-emphasis, a load resistance determining the gain of the differential circuit has been formed by an externally-mounted resistance and it has been impossible to make the value of the resistance large.

Therefore, the following problems are involved: 1. The obtainable detection output is only several tens of mV-500 mV or so. Since the detection output is small, an amplifier circuit is required separately from the FM multiplex demodulator circuit constructed into the semiconductor integrated circuit device. 2. Since the load of the detection circuit is the externally-mounted resistance, the gain of this circuit is determined by the ratio between the externally-mounted resistance and an internal resistance (a resistance formed within the semiconductor integrated circuit). The dispersion of the values of the internal resistances is as large as ±30 to 50% or so with respect to a design value, so that the gains are largely dispersed. 3. The LPF (low-pass filter) has a low input impedance, so that its impedance matching with the detection circuit cannot be established. Where the LPF and the detection circuit are directly coupled, the intrinsic characteristic of the LPF cannot be attained.

SUMMARY OF THE INVENTION

This invention has been made in order to solve the above problems, and has for its objects (1) to enlarge the detection output, (2) to reduce the dispersion of the detection outputs and (3) to establish impedance matching between the LPF and the detection circuit, without increasing the number of pins in the FM multiplex demodulator circuit constructed into a semiconductor integrated circuit.

The fundamental construction of this invention for accomplishing the objects resides in an FM multiplex demodulator circuit constructed into a semiconductor integrated circuit, which employs, within a semiconductor integrated circuit, at least a double balance type synchronous detection circuit which includes load elements formed within the semiconductor integrated circuit, a pair of negative feedback type differential amplifier circuits which amplify a pair of detection outputs from the detection circuit and also perform de-emphasis thereof, respectively, and a pair of feedback circuits which include low output impedances connected to outputs of the negative feedback type differential amplifier circuits, respectively.

BRIEF DESCRIPTION OF THE DRAWING

The single figure is a circuit diagram showing an embodiment of this invention.

DETAILED DESCRIPTION OF THE INVENTION

A double balance type synchronous detection circuit composed of transistors $Q_1 - Q_6$ and resistances $R_1 - R_6$ has its load resistances $R_1$ and $R_2$ formed within a semiconductor integrated circuit IC indicated by a broken line in the figure. Detection outputs of the detector circuit are respectively amplified by negative feedback type differential amplifier circuits formed within the semiconductor integrated circuit, and are delivered through emitter follower output circuits to output pins ③ and ⑤. More specifically, a subcarrier signal $V_{REF}$ (38 kHz) which is formed from a pilot signal (19kHz) in an FM stereo composite signal received is applied between the base of the transistor $Q_3$ (and $Q_6$) and the base of the transistor $Q_4$ (and $Q_5$) of the double balance type synchronous detection circuit. On the other hand, the composite signal is applied to the bases of the transistors $Q_1$ and $Q_2$. Thus, a right channel detection output is obtained at an output $O_1$ of the synchronous detection circuit, while a left channel detection output is acquired at an output $O_2$. The right channel detection output is amplified by a differential amplifier circuit which is composed of transistors $Q_7$, $Q_8$, and $Q_{10}$ and diode $Q_9$, resistances $R_7$ and $R_8$ and a constant-current load $I_{01}$, and it is delivered as an output through an emitter follower circuit which is composed of a transistor $Q_{11}$ and a constant-current load $I_{02}$. The left channel detection is amplified by a differential amplifier circuit which is composed of transistors $Q_{12}$, $Q_{13}$ and $Q_{15}$ and diode $Q_{14}$, resistances $R_9$ and $R_{10}$ and a constant-current load $I_{03}$, and it is delivered as an output through an emitter follower circuit which is composed of a transistor $Q_{16}$ and a constant-current load $I_{04}$.

An externally-mounted pin ① is a power supply terminal, and pins ② and ④ are feedback terminals of the differential amplifier circuits, respectively.

Resistances $R_{11}$, $R_{12}$ ($R_{14}$, $R_{15}$) which are externally mounted on the power supply terminal ①, the feedback terminal ②④ and the output terminals ③⑤ are d.c. bias resistances. A capacitor $C_2$ ($C_4$) is a de-emphasis capacitor. A series circuit consisting of a resistance $R_{13}$ ($R_{16}$) and a capacitor $C_1$ ($C_3$) forms an a.c. feedback circuit.

In accordance with the invention, its objects can be achieved on the following ground:

First, since the detection output is amplified by the amplifier circuit formed within the same semiconductor integrated circuit, a large detection output is obtained. The gain of the detection circuit is determined by the ratio between the values of the resistance elements formed within the semiconductor integrated circuit, and the dispersion of the resistance ratios is small, so that the dispersion of the detection outputs can be made small.

Further, since the output circuit is constructed of an emitter follower circuit of low output impedance, impedance matching of the output circuit with the LPF of low impedance can be established, and the output circuit and the LPF can be directly coupled. Thus, the intrinsic characteristic of the LPF can be maintained.

The output terminal serves also for the terminal with which the de-emphasis circuit is to be connected, so that the number of externally-mounted pins does not increase.

Another advantage of the invention is that the constants of the de-emphasis circuit can be freely selected without considering the gain of the detection circuit. Still another advantage is that, by additionally providing a variable resistance $R_{16}$ between the feedback terminals ② and ④ of the negative feedback type differential amplifier circuits which amplify the detection outputs of the right channel and the left channel respectively, the separation control between both the channels can be effected very simply.

More specifically, due to the connection of the resistance $R_{16}$, e.g. the right-side, output R is attenuated and is applied to the base of the transistor $Q_{13}$ constituting the left-side differential amplifier circuit. On the other hand, even when the left-side detection output L and a right-side leakage signal component $\Delta R$ are applied to the base of the transistor $Q_{12}$, the right-side signals are applied to the bases of the differential pair transistors $Q_{12}$ and $Q_{13}$ in phase at this time. Therefore, by adjusting the right-side attenuation signal level, which is impressed on the base of the transistor $Q_{13}$, so as to become equal to the leakage signal $\Delta R$ by means of the resistance $R_{16}$, only the left-side output L is obtained at the collector of the transistor $Q_{13}$, and excellent separation between both the channels can be obtained. This technical result is similarly achieved for the separation of the right-side output R. The same result is attained when the resistance $R_{16}$ for the separation is connected between the output terminals ③ and ⑤.

This invention is not restricted to the foregoing embodiment, but it can adopt various aspects of performance.

By way of example, the emitter resistances $R_7$, $R_8$ and $R_9$, $R_{10}$ of the negative feedback type amplifier circuits may be omitted. The constant-current circuits $I_{02}$ and $I_{04}$ of the output circuits may be mere resistances. Further, the output circuit may be made a push-pull circuit or an n-p-n differential amplifier circuit by subjecting the detection output to a level shift by means of a p-n-p transistor.

We claim:

1. An FM multiplex demodulator circuit comprising: an integrated circuit including:
 a first terminal to which a power supply voltage is applied,
 a second terminal to which a reference voltage is applied,
 third, fourth, fifth and sixth terminals,
 a double balance type synchronous detection circuit coupled between said first and second terminals, and having first input to which a subcarrier signal is applied, a second input to which a stereo composite signal is applied, and first and second outputs from which respective channel detection outputs are obtained, first and second load elements being respectively connected between said first and second outputs of said detection circuit and said first terminal, and
 first and second negative feedback type differential amplifier circuits coupled between said first and second terminals, having respective first inputs connected to the first and second outputs of said detection circuits, respective second inputs connected to said fifth and sixth terminals and respective outputs for deriving first and second demodulated output signals coupled to said third and fourth terminals; and
 a pair of feedback circuits connected between said third and fourth terminals respectively and said first terminal for providing feedback of said first and second demodulated output signals to said first and second negative feedback type differential amplifier circuits respectively, and including respective series circuits each of which comprises first and second resistors connected in series between said first terminal and said respective third and fourth terminals, said fifth and sixth terminals being connected to respective junctures between said first and second resistors in said series circuits.

2. An FM multiplex demodulator circuit according to claim 1, further comprising a variable resistance connected between said fifth and sixth terminals.

3. An FM multiplex demodulator circuit according to claim 2, further comprising respective emitter follower circuits coupling the respective outputs of said first and second differential amplifier circuits to said third and fourth terminals.

4. An FM multiplex demodulator circuit according to claim 2, wherein each of said feedback circuits further comprises a resistance and a capacitor connected in series between said first terminal and said respective fifth and sixth terminals.

5. An FM multiplex demodulator circuit according to claim 4, wherein each of said feedback circuits comprises a respective de-emphasis capacitor connected between said third and fifth terminals and between said fourth and sixth terminals, respectively.

6. An FM multiplex demodulator circuit according to claim 5, further comprising respective emitter follower circuits coupling the respective outputs of said first and second differential amplifier circuits to said third and fourth terminals.

* * * * *